(12) United States Patent
Loopstra et al.

(10) Patent No.: US 8,300,208 B2
(45) Date of Patent: Oct. 30, 2012

(54) LITHOGRAPHIC APPARATUS AND A METHOD TO COMPENSATE FOR THE EFFECT OF DISTURBANCES ON THE PROJECTION SYSTEM OF A LITHOGRAPHIC APPARATUS

(75) Inventors: Erik Roelof Loopstra, Eindhoven (NL); Maurice Willem Jozef Etiënne Wijckmans, Eindhoven (NL); Robertus Leonardus Tousain, Eindhoven (NL); Adrianus Hendrik Koevoets, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 447 days.

(21) Appl. No.: 12/616,312

(22) Filed: Nov. 11, 2009

(65) Prior Publication Data
US 2010/0149516 A1 Jun. 17, 2010

Related U.S. Application Data

(60) Provisional application No. 61/121,871, filed on Dec. 11, 2008.

(51) Int. Cl.
*G03B 27/42* (2006.01)
*G03B 27/58* (2006.01)
*G03B 27/62* (2006.01)

(52) U.S. Cl. ............................... 355/53; 355/72; 355/75
(58) Field of Classification Search .................... 355/53, 355/72–76; 356/500
See application file for complete search history.

(56) References Cited

U.S. PATENT DOCUMENTS

| 5,876,012 | A | 3/1999 | Haga et al. |
| 6,170,622 | B1 * | 1/2001 | Wakui et al. .................. 188/378 |
| 6,322,060 | B1 * | 11/2001 | Mayama et al. .............. 267/136 |
| 6,359,688 | B2 | 3/2002 | Akimoto et al. |
| 6,864,962 | B2 | 3/2005 | Morisada |
| 6,937,317 | B2 | 8/2005 | Morisada |

(Continued)

FOREIGN PATENT DOCUMENTS
JP          11-307448 A        11/1999
(Continued)

OTHER PUBLICATIONS

English-Language Translation of Notice of Reasons for Rejection directed to related Japanese Patent Application No. 2009-276028, mailed Dec. 13, 2011, from the Japanese Patent Office; 3 pages.

*Primary Examiner* — Hung Henry Nguyen
(74) *Attorney, Agent, or Firm* — Sterne, Kessler, Goldstein & Fox P.L.L.C.

(57) ABSTRACT

Embodiments of the invention provide a lithographic apparatus including an illumination system configured to condition a radiation beam, a patterning device support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, an active air mount to support the projection system, the active air mount including at least one actuator, and a feed-forward device, the feed-forward device being configured to provide on the basis of a set-point signal of a movable object, a feed-forward signal to the at least one actuator, wherein the feed-forward signal is designed to decrease a disturbance effect on the projection system due to movement of the movable object.

15 Claims, 3 Drawing Sheets

U.S. PATENT DOCUMENTS

| | | |
|---|---|---|
| 7,063,192 B2 | 6/2006 | Mayama |
| 7,264,235 B2 | 9/2007 | Morisada |
| 7,275,627 B1 | 10/2007 | Mayama |
| 7,671,963 B2 * | 3/2010 | Streefkerk et al. ............ 355/30 |
| 7,710,540 B2 | 5/2010 | Loopstra et al. |
| 2007/0097340 A1 * | 5/2007 | Yuan et al. ............ 355/53 |

FOREIGN PATENT DOCUMENTS

| | | |
|---|---|---|
| JP | 2001-126977 A | 5/2001 |
| JP | 2001-140972 A | 5/2001 |
| JP | 2004-100953 A | 4/2004 |
| JP | 2008-258613 A | 10/2008 |

* cited by examiner

LITHOGRAPHIC APPARATUS AND A METHOD TO COMPENSATE FOR THE EFFECT OF DISTURBANCES ON THE PROJECTION SYSTEM OF A LITHOGRAPHIC APPARATUS

CROSS REFERENCE TO RELATED APPLICATIONS

This application claims benefit under 35 U.S.C. §119(e) to U.S. Provisional Patent Application No. 61/121,871, filed Dec. 11, 2008, which is incorporated by reference herein in its entirety.

BACKGROUND

1. Field

Embodiments of the present invention relate to a lithographic apparatus and a method to compensate for the effect of disturbances on the projection system of a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The forces required for scanning movements of movable objects of the lithographic apparatus, such as a substrate support, cause reaction forces and torques in the lithographic apparatus. Such reaction forces and torques may lead to disturbances in the lithographic apparatus. In particular, the disturbance forces may be propagated to other parts the lithographic apparatus, for instance to the projection system. The resulting movements of the projection system may lead to imaging errors and/or a decrease in throughput of the lithographic apparatus.

Similar reaction forces and torques and consequent movements of parts of a lithographic apparatus may result from the actuation forces of other movable objects of a lithographic apparatus. Such other moveable objects are, for instance, patterning device supports, patterning device masking devices, or robots for handling substrates or patterning devices.

In a prior art lithographic apparatus it has been proposed to provide a so-called balance mass. Such balance mass is connected to the movable object and is configured to move in a contra-direction, i.e. a direction opposed to the actuation direction, so that the reaction forces are compensated. These balance masses are provided for the main direction of movement of the respective moveable object, for instance the substrate support.

Due to the higher demands on wafer throughput, the accelerations of scan set-points increase, hence introducing higher disturbance forces. At the same time the required accuracy of lithography scanners increase resulting in lower allowable disturbance levels.

As a result of the increasing demands on wafer throughput and accuracy, balance masses may be required in non-dominant directions, i.e. non-main directions of movement of the respective movable object, for instance for rotational directions of the substrate stage, to meet these demands. The provision of such balance masses may result in a more complex and expensive construction. Also for some embodiments the compensation caused by a balance mass may no longer suffice.

It is remarked that U.S. Pat. Nos. 5,876,012, 6,322,060, 6,864,962, 6,937,317, 7,063,192, 7,264,235, 7,275,627, the contents of which are herein incorporated by reference in their entirety disclose lithographic or scanning apparatus wherein a disturbance compensation is performed by controlling an active vibration suppression device. None of these publications provides a solution for the above-identified drawback of a prior art lithographic apparatus.

SUMMARY

The inventors have devised a lithographic apparatus in which disturbances of the projection system due to scan forces of a movable object, for instance of the substrate stage, are decreased.

According to an embodiment there is provided a lithographic apparatus including: an illumination system configured to condition a radiation beam; a patterning device support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; an active air mount to support the projection system, said active air mount including at least one actuator; and a feed-forward device, the feed-forward device being configured to provide on the basis of a set-point signal of a movable object, a feed-forward signal to said at least one actuator, wherein the feed-forward signal is designed to decrease a disturbance effect on said projection system due to movement of said movable object.

According to an embodiment there is provided a method to compensate for the effect of disturbances on a projection system of a lithographic apparatus due to actuation of a movable part of said lithographic apparatus, including the steps of: measuring the effect of actuation of a movable part on the projection system, measuring the effect of actuation of one or more active air mounts on the projection system, designing a filter of a feed-forward device on the basis of the measurements, and controlling an actuator of the active air mount on the basis of a feed-forward signal, the feed-forward signal being based on a set-point of said movable part filtered by said filter of the feed-forward device.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
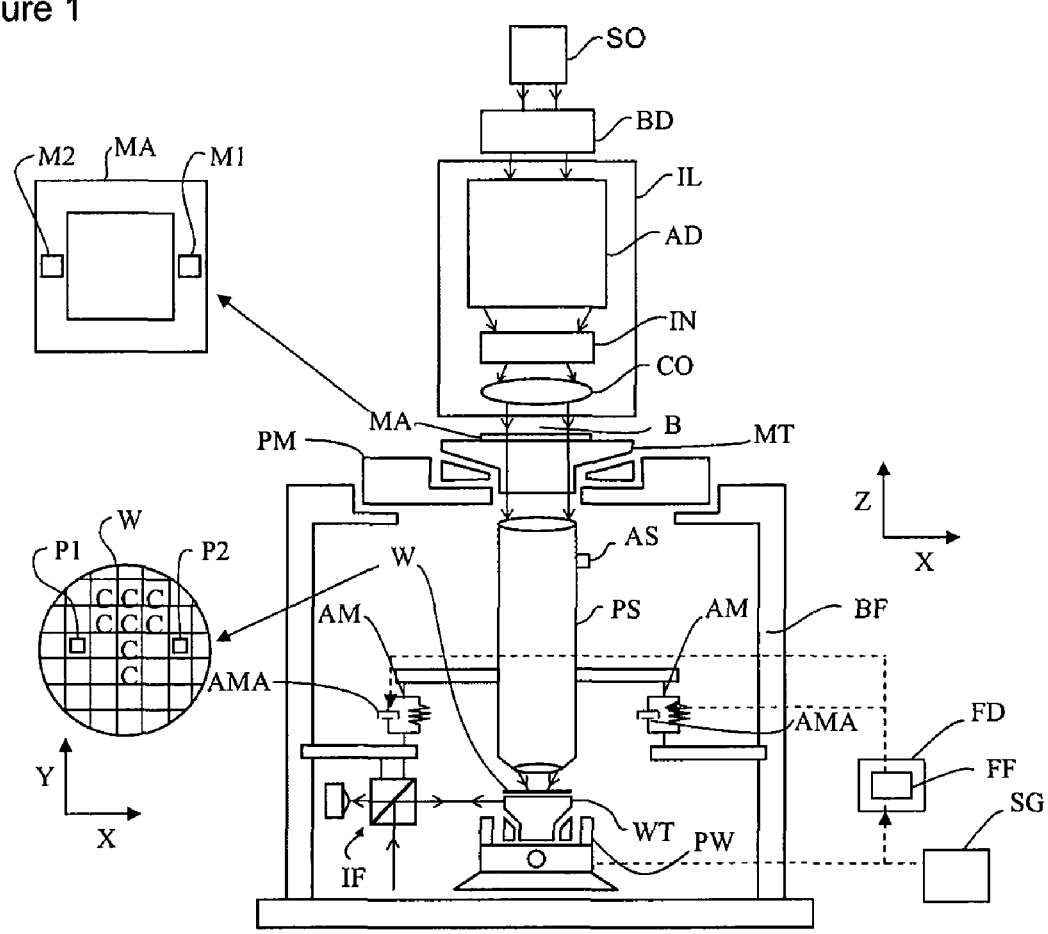
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the mask support structure (e.g., mask table MT), and is patterned by the patterning device. Having traversed mask MA, radiation beam B passes through projection system PS, which focuses the beam onto a target portion C of substrate W. With the aid of second positioning device PW and position sensor IF (e.g. an interferometric device, linear encoder or capacitive sensor), substrate table WT can be moved accurately, e.g. so as to position different target portions C in the path of radiation beam B. Similarly, first positioning device PM and another position sensor (which is not explicitly depicted in FIG. 1) can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioning device PM. Similarly, movement of substrate table WT or "substrate support" may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT or "mask support" and substrate table WT or "substrate support" are kept essentially stationary, while an entire pattern imparted to the radiation beam is projected onto a target portion C at one time (i.e. a single static exposure). Substrate table WT or "substrate support" is then shifted in the X and/or Y direction so that a different target portion C can be exposed. In step mode, the maximum size of the exposure field limits the size of the target portion C imaged in a single static exposure.

2. In scan mode, mask table MT or "mask support" and substrate table WT or "substrate support" are scanned synchronously while a pattern imparted to the radiation beam is projected onto a target portion C (i.e. a single dynamic exposure). The velocity and direction of substrate table WT or "substrate support" relative to mask table MT or "mask support" may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT or "mask support" is kept essentially stationary holding a programmable patterning device, and substrate table WT or "substrate support" is moved or scanned while a pattern imparted to the radiation beam is projected onto a target portion C. In this mode, generally a pulsed radiation source is employed and the programmable patterning device is updated as required after each movement of substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed The lithographic apparatus shown in FIG. 1 includes a set-point generator SG which provides a time dependent set-point, i.e. a desired position quantity, for substrate table WT, for instance to move substrate table WT in correspondence with one of the above-indicated modes. Set-point generator SG may be any device which provides set-points, i.e. desired position quantities, for substrate table WT. The set-point generator may, for instance, be a stand-alone device, or may be incorporated in another device, for instance substrate table WT control device, or a main computer or controller of the lithographic apparatus. Such set-point generator SG for a substrate table WT of a lithographic apparatus is known in the art.

The desired position quantity may be a desired position of substrate table WT, but also a desired speed or acceleration. The set-point may include a single degree of freedom set-point, but is typically a desired position quantity in three or six degrees of freedom.

The set-points are fed to a control device which provides a control signal to positioner PW on the basis of difference between the desired position of substrate table WT and the actual position of substrate table WT. On the basis of the control signal, substrate table WT is actuated by exerting forces on wafer table WT to move substrate table WT and the substrate supported thereon to the desired position. The provision of these actuation forces also results in reaction forces and/or torques of positioner PW onto base frame BF.

The reaction forces and/or torques may be propagated through the lithographic apparatus, resulting in movements, for instance vibrations, of critical parts of the lithographic apparatus, in particular projection system PS, also referred to as projection optics box or POB. These movements may result in imaging errors of the lithographic apparatus, or may have a negative effect on the throughput of the lithographic apparatus. Other movable parts of the lithographic apparatus such as mask table MT, a patterning device masking device often referred to as REMA, or robots for handling substrates or patterning devices may cause similar disturbances of projection system PS.

It has been proposed to use balance masses to compensate the reaction forces in the main scanning direction. Positioner PW is then connected to such balance mass. When an actuation force is exerted on wafer table WT, the reaction force is used to move the balance mass in an opposed direction therewith, substantially compensating the reaction force with respect to the other parts of the lithographic apparatus. However, with increasing demands on accuracy and throughput, such balance mass in the main direction may not provide sufficient compensation for the reaction forces, in particular in non-dominant directions of wafer table WT.

In the lithographic apparatus shown in FIG. 1, active air mounts AM are provided. These air mounts AM support projection system PS, and are designed to actively maintain the projection system in its position. For this purpose the air mounts include actuators AMA which can provide actuation forces on projection system PS. Acceleration sensors AS are provided on projection system PS to measure accelerations of projection system PS. These measured accelerations may be used to control the actuators AMA of the air mounts AM.

In accordance with an embodiment of the present invention, a feed-forward device FD is provided which provides a feed-forward signal on the basis of substrate table WT setpoint signal generated by set-point generator SG. A feed-forward filter FF is provided in feed-forward device FD which filters the set-point signal of wafer table WT to obtain a feed-forward signal for the actuator of the respective air mount AM. Feed-forward device FD is designed to provide a feed-forward signal which, by actuating actuators AMA of air mounts AM, compensates for the reaction forces resulting from the actuation of wafer table WT, in particular in the non-dominant directions, for instance a reaction torque resulting from exerting a force or torque on wafer table WT.

In an embodiment, feed-forward device FD provides a feed-forward signal which is equal to the set-point of the wafer table filtered with a filter, characterized by a transfer function $\vec{H}_{filter}(s)$, that is the product of the inverse of the transfer function $H_{AM->PS}(s)$ from air mount AM to projection system PS and the transfer function $\vec{H}_{WT->PS}(s)$ of wafer table WT to projection system PS. In an equation this relation may be expressed as:

$$\vec{H}_{filter}(s) = (H_{AM->PS}(s))^{-1} \cdot \vec{H}_{WT->PS}(s),$$

where s is the Laplace complex argument, also referred to as the Laplace complex frequency, showing that the filter is a function of the frequency.

Such a filter is referred to, hereinafter, as the ideal filter, and would result in a feed-forward signal which would substantially compensate the reaction forces of the actuation of wafer table WT. However, the filter of this equation may be rather complex for the total frequency band and only a relatively simple filter may be able to fit the dominant dynamics in a particular frequency band, for instance 5-20 Hz.

As a more practical approach, a fit of lower order, for instance of second order fit, may be used. As an example, a second order fit may be based on a filter $H_2(s)$ given by the equation:

$$H_2(s) = \frac{b_1}{a_1 s^2 + a_2 s + a_3},$$

where $b_1$, $a_1$, $a_2$, and $a_3$ are filter coefficients.

It has been found that such a second order fit on the basis of the measurements of excitation of projection system PS due to movements of wafer table WT and actuator AMA of air mount AM may provide an adequate description of the ideal filter, at least in the relevant frequency range, for instance 5-20 Hz. In alternative embodiments it is possible to use a summation of second order fits to describe the filter, or any other approximation of the ideal filter.

It is remarked that in alternative embodiments, feed-forward device FD may be provided with other devices than feed-forward filter device FF to determine a feed-forward signal to decrease disturbance effects on the projection system PS. Such alternative means may for instance include a look-up table that can be read out on the basis of the set-point signal of wafer table WT. The look-up table may be generated with measurement data of the excitation of projection system PS by actuation of wafer table WT and air mount actuator AMA. Any other suitable means may also be provided.

Figure 2A:
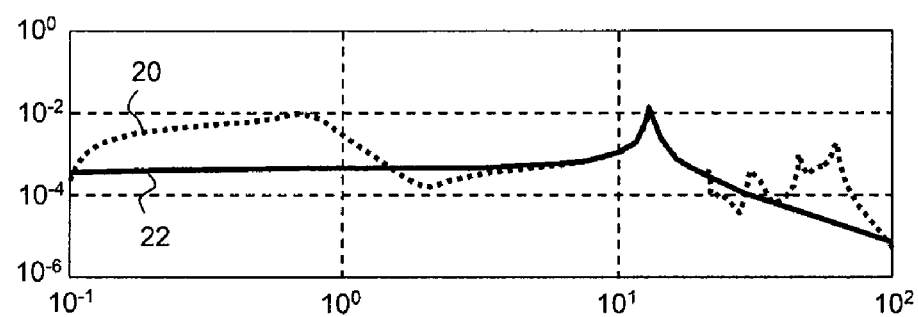
FIG. 2a depicts a Bode plot of magnitude as function of frequency of an ideal filter and a filter of lower order according to an embodiment of the invention.
Figure 2B:
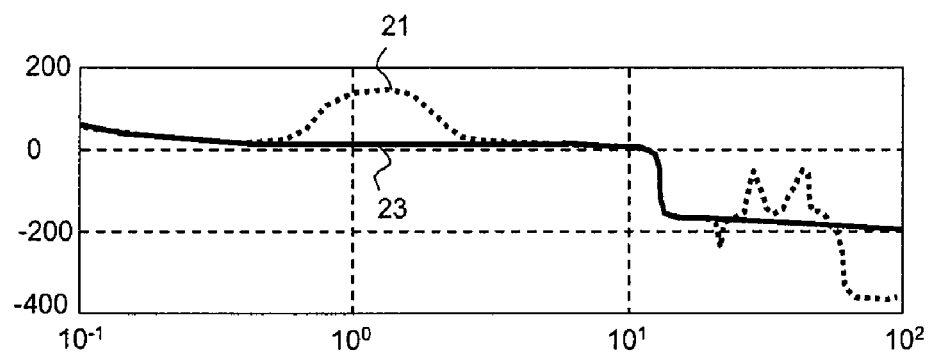
FIG. 2b depicts a Bode plot of phase as function of frequency of the ideal filter and the filter of lower order, referred to in FIG. 2a, according to an embodiment of the invention.

The graph 20 in FIG. 2a illustrates an example of a transfer function of an approximately ideal fit filter; graph 22 in FIG. 2a shows a transfer function of a second order fit using the above equation for $H_2(s)$. Along the horizontal axis is plotted the frequency in Hz, and along the vertical axis is plotted the modulus of the transfer functions in $N/(m/s^2)$. Similarly, the graphs 21 and 23 in FIG. 2b illustrate the phase (in degrees) of respectively the transfer function of the approximately ideal fit filter and the transfer function of the second order fit using the above equation for $H_2(s)$. Along the horizontal axis is plotted the frequency in Hz, and along the vertical axis is plotted the phase in degrees.

It is remarked that further filters, such as low pass and high pass filters, may be provided, for instance to obtain a filter in particular designed for a relevant frequency range. In an example, the relevant frequency range is 5-20 Hz.

In order to design the filter of feed-forward device FD, the disturbance path (WT to PS) and the compensation path (AM to PS) may be identified by performing measurements in the lithographic apparatus. The advantage of using measurements is that modeling inaccuracies are avoided. The disturbance path can be measured by measuring the effect of wafer table WT accelerations on the position of the projection system, and using the time data to identify a frequency response function, for instance accelerations of projection system PS using the acceleration sensors provided on the projection system as described above. The compensating path can be measured by exciting actuators AMA of the respective air mount AM and measuring the resulting effect on the position of projection system PS, for instance accelerations of projection system PS. The accelerations of projection system PS may be measured by acceleration sensors AS.

It is remarked that for each air mount AM such measurements have to be made. In practice, projection system PS may be supported by multiple air mounts, for instance three air mounts AM, each air mount containing one or more, for instance two, actuators.

The results of the measurements of the relation between the wafer table actuation and accelerations of projection system PS and the relation between air mount actuation and accelerations of projection system PS may be used for design of the filter, for instance the second order fit model described above.

The resulting filter can be used as explained above to provide a feed-forward signal fed to air mount AM to compensate for the disturbance effect of wafer table actuations on the position of projection system PS. Due to the feed-forward of the set-point of the wafer table to air mount AM, these effects may be substantially reduced, for instance by 90% or more.

Figure 3:
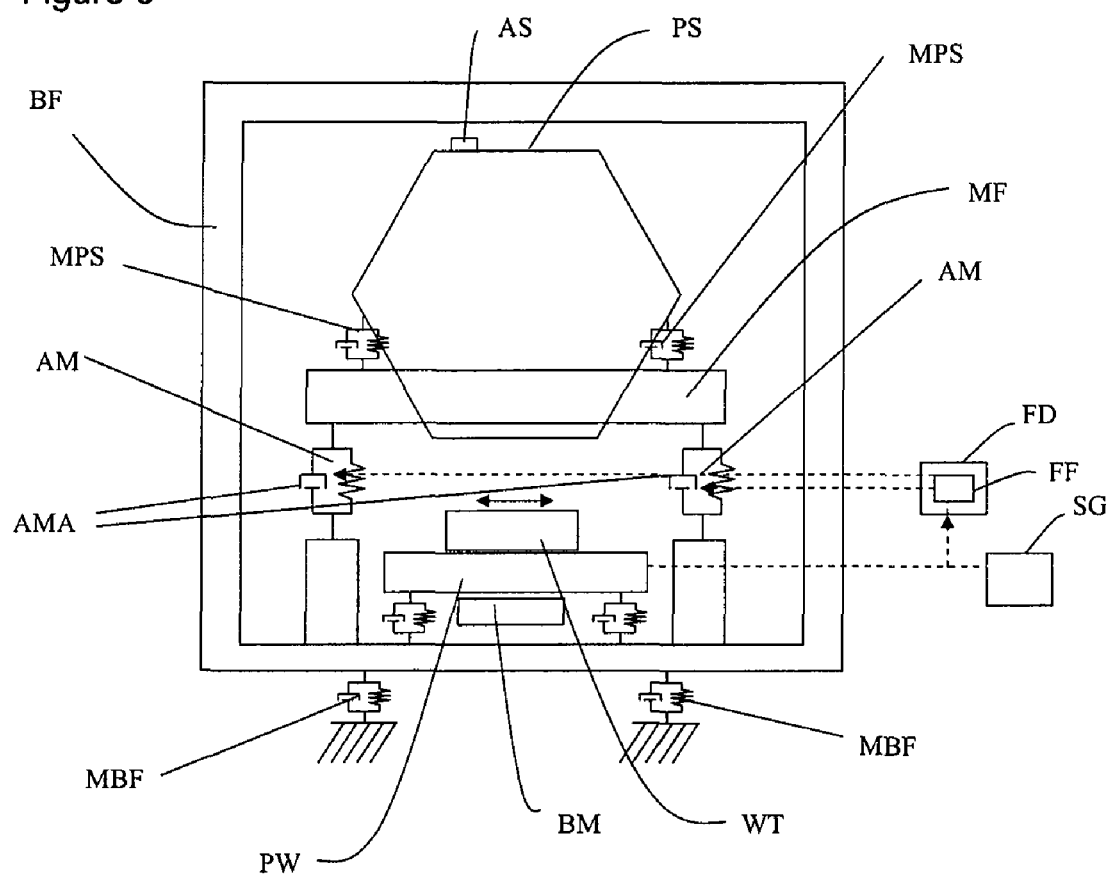
FIG. 3 depicts a lithographic apparatus according to an alternative embodiment of the invention.

FIG. 3 shows partially and schematically a lithographic apparatus including wafer table WT actuated by a positioner PW and projection system PS. The wafer table WT is connected to base frame BF which is a main support frame of the lithographic apparatus. Base frame BF is supported by supports MBF which may be active or passive supports. On base frame BF a number of active air mounts are provided which provide support to a so-called metrology frame or metro-frame MF which at its turn supports projection system PS via passive or active mounts MPS. Active air mounts AM support indirectly projection system PS.

Also connected to wafer table WT, a balance mass BM is provided which is movable in the main directions of movement of wafer table WT to compensate for the reaction forces in these directions. However, reaction forces in other directions such as a torque may not be compensated by balance mass BM, and propagate through the lithographic apparatus.

In accordance with an embodiment of the invention, a feed-forward device FD is provided which is designed to provide a feed-forward signal to an actuator AMA of active air mounts AM to compensate for the disturbance forces propagated through the lithographic apparatus. The feed-forward signal is based on the set-point signal for the wafer table, which is generated by set-point-generator SG. A feed-forward filter FF is provided in feed-forward device FD, which is designed in an embodiment to filter the set-point signal of set-point generator SG in order to obtain the feed-forward signal. Further filters, such as low-pass or band filters, may be provided.

Feed-forward device FD is configured to provide an actuation signal for air mounts AM which compensates for the disturbance forces which may be exerted on projection system PS as a result of the actuation of wafer table WT. Feed-forward device FD may include a filter as described above with respect to the embodiment of FIG. 1. By provision of the feed-forward force, an effective compensation of the reaction forces may be obtained.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a: subtrate;
a projection system configured to project the patterned, radiation beam onto a target portion of the substrate;
an active air mount to support said projection system, the active air mount comprising at least one actuator; and
a feed-forward device, the feed-forward device being configured to receive a set-point signal, the set point signal being based on a difference between a desired position of a moveable, object and an actual position of the moveable object, and. provide on the basis of the set-point signal, a feed-forward signal to the at least one actuator, wherein the feed-forward signal is designed to decrease a disturbance effect on the projection system due to movement of the movable object.

2. The lithographic apparatus of claim 1, wherein the feed-forward device comprises a filter based on the product of the inverse of the transfer function from the actuator to the projection system and the transfer function of an actuator of said movable object to said projection system.

3. The lithographic apparatus of claim 1, wherein said feed-forward device comprises a filter comprising a second order fit of measurements on the effects of excitation of said movable object and said actuator.

4. The lithographic apparatus of claim 1, wherein said feed-forward device comprises a filter comprising a summation of two or more second order fits of measurements on the effects of excitation of said projection system due to movements of said movable object and said actuator.

5. The lithographic apparatus of claim 1, wherein said feed-forward device further comprises a low-pass or high pass filter.

6. The lithographic apparatus of claim 1, wherein said movable object is said substrate table, said patterning device support, a patterning device mask device configured to mask patternless parts of the patterning device from the radiation beam, or a robot for handling substrates or patterning devices.

7. The lithographic apparatus of claim 1, wherein said movable part is associated with one or more balance masses for compensation of disturbances in at least one dominant direction.

8. The lithographic apparatus of claim 1, wherein said at least one actuator is used for compensation of said disturbance effect in non-dominant directions of said movable object.

9. The lithographic apparatus of claim 8, wherein said non-dominant directions comprise rotational directions.

10. The lithographic apparatus of claim 1, wherein one or more acceleration sensors are provided on said projection system to measure the effect of actuation of said movable object on said projection system.

11. The lithographic apparatus of claim 1, wherein said lithographic apparatus comprises multiple active air mounts to support said projection system, each air mount having an actuator, said feed-forward device being configured to control each actuator dependent on, said set-point signal of said movable object, said feed-forward device comprising a compensation filter for each actuator.

12. A method to compensate for the effect of disturbances on a projection system of a lithographic apparatus due to actuation of a movable part of said lithographic apparatus, comprising:
measuring the effect of actuation of the movable part on the projection system;
measuring the effect of actuation of one or more air mounts on the projection system;
designing a filter of a feed-forward device on the basis of the measurements; and
controlling at least one actuator of said one or more active air mounts on the basis of a feed-forward signal provided by said feed-forward device, said feed-forward signal being based on a set-point of said movable part and filtered by said filter of said feed-forward device, wherein said feed-forward signal is designed to decrease a disturbance effect on said projection system due to movement of said movable part.

13. The method of claim 12, wherein the designing step comprises providing a second order fit on the basis of the measurement results of the measurement steps.

14. The method of claim 13, wherein said second order fit is based on the equation:

$$H_2(s) = \frac{b_1}{a_1 s^2 + a_2 s + a_3}$$

where s is the Laplace complex argument, $H_2(s)$ is a transfer function and $b_1$, $a_1$, $a_2$, and $a_3$ are filter coefficients.

15. The method of claim 12, wherein the designing step comprises making a summation of two or more second order fits on the basis of the measurement results of the measurement steps.

* * * * *